(12) United States Patent
Revol et al.

(10) Patent No.: US 10,485,133 B1
(45) Date of Patent: Nov. 19, 2019

(54) FASTENING DEVICE

(71) Applicants: Legrand France, Limoges (FR);
Legrand SNC, Limoges (FR)

(72) Inventors: Didier Revol, Limoges (FR);
Christophe Cellier, Limoges (FR)

(73) Assignees: LEGRAND FRANCE, Limoges (FR);
LEGRAND SNC, Limoges (FR)

( * ) Notice: Subject to any disclaimer, the term of this patent is extended or adjusted under 35 U.S.C. 154(b) by 133 days.

(21) Appl. No.: 15/923,451

(22) Filed: Mar. 16, 2018

(51) Int. Cl.
*H05K 7/14* (2006.01)
*H05K 7/18* (2006.01)
*A47B 57/40* (2006.01)

(52) U.S. Cl.
CPC ......... *H05K 7/1489* (2013.01); *A47B 57/406* (2013.01); *H05K 7/186* (2013.01)

(58) Field of Classification Search
CPC combination set(s) only.
See application file for complete search history.

(56) References Cited

U.S. PATENT DOCUMENTS

| 6,926,378 | B2* | 8/2005 | Greenwald | H05K 7/1421 |
| | | | | 312/223.1 |
| 8,923,013 | B2* | 12/2014 | Anderson | G02B 6/4452 |
| | | | | 361/801 |
| 9,091,831 | B2* | 7/2015 | Chatellard | H04Q 1/13 |
| 2008/0073469 | A1* | 3/2008 | Mushan | H05K 7/1489 |
| | | | | 248/205.1 |
| 2009/0114785 | A1* | 5/2009 | Huang | H05K 7/1489 |
| | | | | 248/220.31 |
| 2017/0354051 | A1* | 12/2017 | Franz | H05K 7/1489 |
| 2018/0228049 | A1* | 8/2018 | Liao | H05K 7/1489 |

FOREIGN PATENT DOCUMENTS

FR  2 958 969 A1  10/2014

* cited by examiner

*Primary Examiner* — Monica E Millner
(74) *Attorney, Agent, or Firm* — McCormick, Paulding & Huber LLP

(57) ABSTRACT

A fastening device includes a housing and first and second buttons disposed at opposite ends of the housing in a first axial direction. Each of the first and second buttons is actuatable in the first axial direction. The fastening device further includes first and second claws slidably disposed within the housing, each of the first and second claws including a hook portion extending outward from an engagement face of the housing. Each of the first and second claws engages one of the first or second push buttons within the housing so that relative movement of the first and second buttons toward one another moves the hook portions of the first and second claws away from one another in the first axial direction.

20 Claims, 19 Drawing Sheets

FASTENING DEVICE

TECHNICAL FIELD

This application relates to a fastening device and, more particularly, to a fastening device for an upright rack of data center.

BACKGROUND

In telecommunications and/or information technology data centers, panels with system hardware components, such as switches, servers, routers, power supplies, wiring and/or cabling connections, and the like, are typically secured to upright racks or enclosures. Typically, the panels are secured to the upright racks using cage nuts and mounting screws, which require the use of tools, thereby complicating installation.

SUMMARY

According to the present disclosure, a fastening device is provided for securing panels in an upright rack or enclosure of a telecommunications or information technology data center without requiring tools during installation. The fastening device comprises a housing with first and second buttons disposed at opposite ends of the housing in a first axial direction. Each of the first and second buttons is actuatable in the first axial direction. The fastening device further comprises first and second claws slidably disposed within the housing. Each of the first and second claws includes a hook portion extending outward from an engagement face of the housing. Each of the first and second claws engages one of the first or second buttons within the housing so that relative movement of the first and second buttons toward one another moves the hook portions of the first and second claws away from one another in the first axial direction.

According to the present disclosure, the fastening device may comprise a resilient member disposed within the housing. The resilient member may bias the first and second buttons away from one another in the first axial direction and may bias the hook portions of the first and second claws toward one another in the first axial direction.

According to the present disclosure, the fastening device may further include first and second alignment tabs extending outward from the engagement face adjacent the hook portions of the first and second claws. The hook portions may be slidable between a positioned in which they are closer to one another in the first axial direction than the first and second alignment tabs when the first and second buttons are un-actuated and a position in which the hook portions are the same distance from one another in the first axial direction as the first and second alignment tabs when the first and second buttons are fully actuated.

According to the present disclosure, the hook portion of the first claw may include an engagement feature in the shape of an inverted triangle, with an upper surface extending perpendicular to the first axial direction, and a lower surface including a first actuation surface portion sloping downward relative to the upper surface from a distal end of the hook portion to a peak and a first contact surface portion sloping upward relative to the upper surface from the peak toward the engagement face. The slope of the first contact surface portion relative to the upper surface is preferably greater than the slope of the first actuation surface portion relative to the upper surface.

According to the present disclosure, the hook portion of the second claw may include an engagement feature in the shape of a triangle, with a lower surface extending perpendicular to the first axial direction, and an upper surface including a second actuation surface portion sloping upward relative to the lower surface from a distal end of the hook portion to a peak and a second contact surface portion sloping downward relative to the upper surface from the peak toward the engagement face. The slope of the second contact surface portion relative to the lower surface is preferably greater than the slope of the second actuation surface portion relative to the lower surface.

These and other objects, features and advantages of the present disclosure will become apparent in light of the detailed description of embodiments thereof, as illustrated in the accompanying drawings.

DETAILED DESCRIPTION

Figure 1:
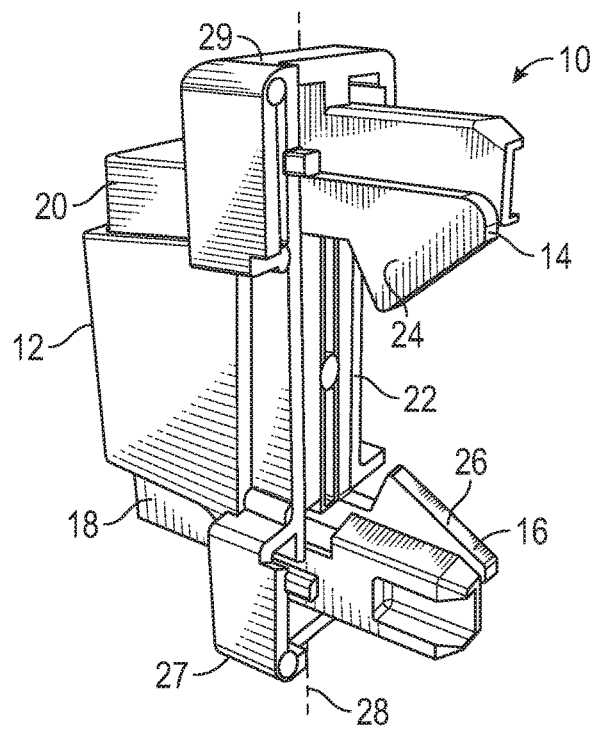
FIG. 1 is a front left-hand side perspective view of a fastening device according to the present disclosure.

Before the various embodiments are described in further detail, it is to be understood that the invention is not limited to the particular embodiments described. It will be understood by one of ordinary skill in the art that the devices and systems described herein may be adapted and modified as is appropriate for the application being addressed and that the devices and systems described herein may be employed in other suitable applications, and that such other additions and modifications will not depart from the scope thereof.

In the drawings, like reference numerals refer to like features of the systems of the present application. Accordingly, although certain descriptions may refer only to certain figures and reference numerals, it should be understood that such descriptions might be equally applicable to like reference numerals in other figures.

Referring to FIG. 1, a fastening device 10 according to the present disclosure is shown. The fastening device 10 includes a housing 12, first and second claws 14, 16, and first and second push buttons 18, 20 for actuating the first and second claws 14, 16, respectively.

The housing 12 includes an engagement face 22 configured to engage a panel and/or an upright rack of a telecommunications or information technology data center. Each of the first and second claws 14, 16 includes a hook portion 24, 26, respectively, extending perpendicularly outward from the housing 12 through the engagement face 22. The hook portions 24, 26 are slidable along the engagement face 22 in a first axial direction 28 as will be discussed in greater detail below. The first and second push buttons 18, 20 extend outward from the housing 12 at opposite sides thereof in the first axial direction 28 and are also slidable relative to the housing 12 in the first axial direction 28. As illustrated, the first and second push buttons 18, 20 may be recessed relative to lower and upper ends 27, 29, respectively, of the housing 12 in the first axial direction 28.

Figure 2:
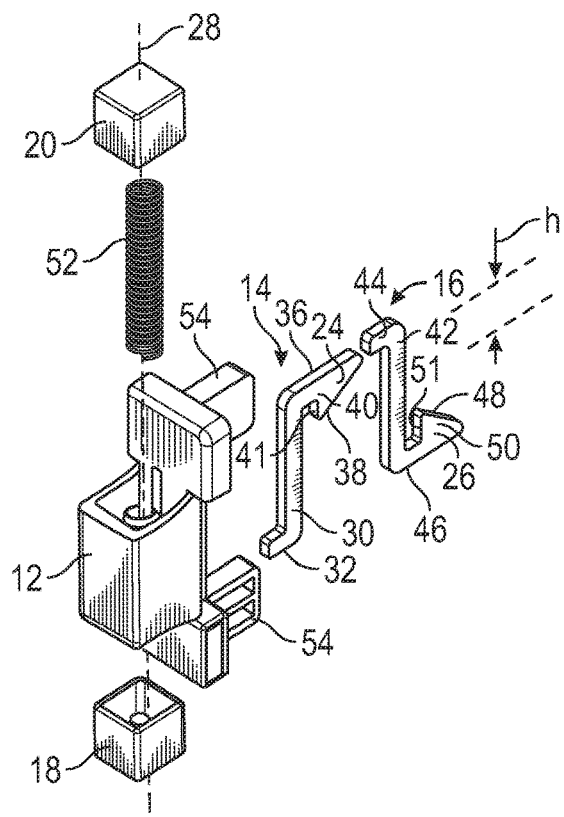
FIG. 2 is a rear left-hand side exploded perspective view of the fastening device of FIG. 1.
Figure 3:
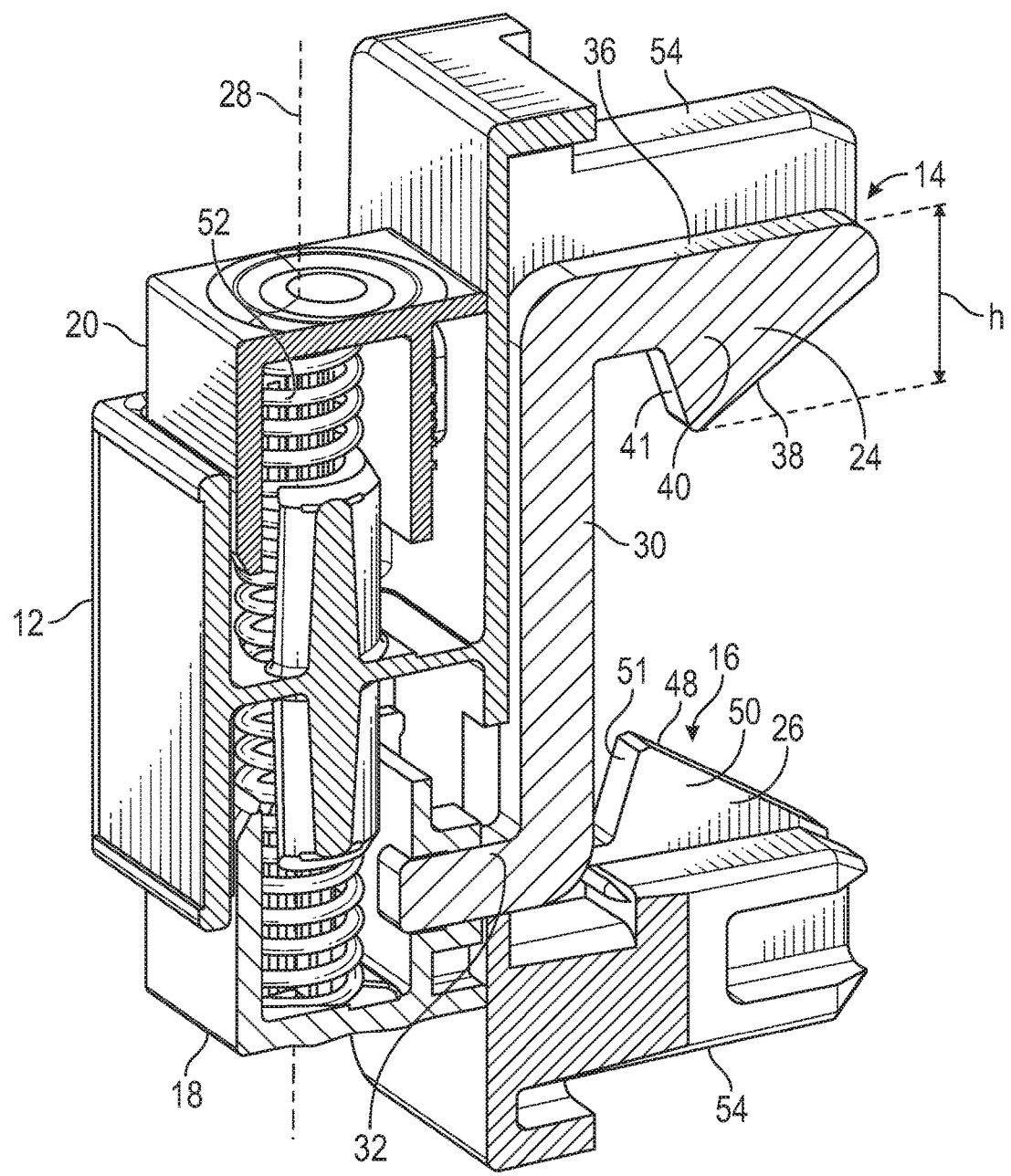
FIG. 3 is a front left-hand side cross-sectional view of the fastening device of FIG. 1.

Referring to FIGS. 2 and 3, the first claw 14 has an elongated body 30 extending in the first axial direction 28. The hook portion 24 of the first claw 14 is formed at one axial end of the elongated body 30 and a base portion 32 is formed at the other axial end of the elongated body 30. The base portion 32 and the elongated body 30 of the first claw 14 are disposed within the housing 12, with the hook portion 24 extending perpendicularly outward from the housing 12 through the engagement face 22 as discussed above. The base portion 32 engages the first push button 18 within the housing 12 and the hook portion 24 protrudes from the engagement face 22 of the housing 12 proximate the second push button 20.

The hook portion 24 of the first claw 14 includes a flat upper surface 36 and a lower surface 38 shaped to form an engagement feature 40, which includes a contact surface portion 41 configured to engage the panels and/or the upright racks. For example, as seen in FIGS. 2 and 3, the flat upper surface 36 and the lower surface 38 form engagement feature 40 in the shape of an inverted triangle, with the contact surface portion 41 being a portion of the lower surface 38 forming the side of the inverted triangle proximate the elongated body 30. The engagement feature 40 is formed with a height h slightly smaller than the corresponding openings formed in the panels and/or the upright racks so that the engagement feature 40 may pass therethrough.

The second claw 16 has the same shape as the first claw 14 but is inverted relative to the first claw 14 when installed in the housing 12. Specifically, the second claw 16 has an elongate body 42 extending in the first axial direction 28 and the hook portion 26 of the second claw 16 is formed at one axial end of the elongated body 42, while a base portion 44 is formed at the other axial end of the elongated body 42. The base portion 44 and the elongated body 42 of the second claw 16 are disposed within the housing 12, with the hook portion 26 extending perpendicularly outward from the housing 12 through the engagement face 22 as discussed above. The base portion 44 engages the second push button 20 within the housing 12 and the hook portion 26 protrudes from the engagement face 22 of the housing 12 proximate the first push button 18.

The hook portion 26 of the second claw 16 includes a flat lower surface 46 and an upper surface 48 shaped to form an engagement feature 50, which includes a contact surface portion 51 configured to engage the panels and/or the upright racks. For example, as seen in FIGS. 2 and 3, the flat lower surface 46 and the upper surface 48 form engagement feature 50 in the shape of a triangle, with the contact surface portion 51 being a portion of the upper surface 48 forming the side of the triangle proximate the elongated body 42. Like the engagement feature 40, the engagement feature 50 is formed with the height h slightly smaller than the corresponding openings formed in the panels and/or the upright racks so that the engagement feature 50 may pass therethrough.

The fastening device 10 further includes a resilient member 52 disposed within the housing 12 that biases the base portion 32 of the first claw 14 and the first push button 18 in a direction away from the base portion 44 of the second claw 16 and the second push button 20, and vice versa. The resilient member 52 may be, for example, a helical compression spring or the like.

The housing 12 may also include alignment tabs 54 extending outward from the engagement face 22 and configured to engage corresponding openings formed in the panel and/or the upright rack of the telecommunications or information technology data center. Each alignment tab 54 is positioned adjacent to one of the first or second hook portions 24, 26. The positioning of the alignment tabs 54 on the engagement face 22 is fixed while the first and second hook portions 24, 26 are able to move in the first axial direction 28 as discussed above. The alignment tabs 54 are positioned on the engagement face 22 to be the same distance apart from one another in the first axial direction 28 as the first and second hook portions 24, 26 when the first and second push buttons 18, 20 are fully actuated and to be spaced farther apart from one another in the first axial direction 28 than the first and second hook portions 24, 26 when the first and second push buttons 18, 20 are un-actuated.

The housing 12 and push buttons 18, 20 may be formed from a moldable plastic, composite or polymeric material such as Zamak or the like. The first and second claws 14, 16 are preferably formed from steel to provide the fastening device 10 with sufficient strength for securing panels and/or components with increased weight to the upright racks.

Figure 4:
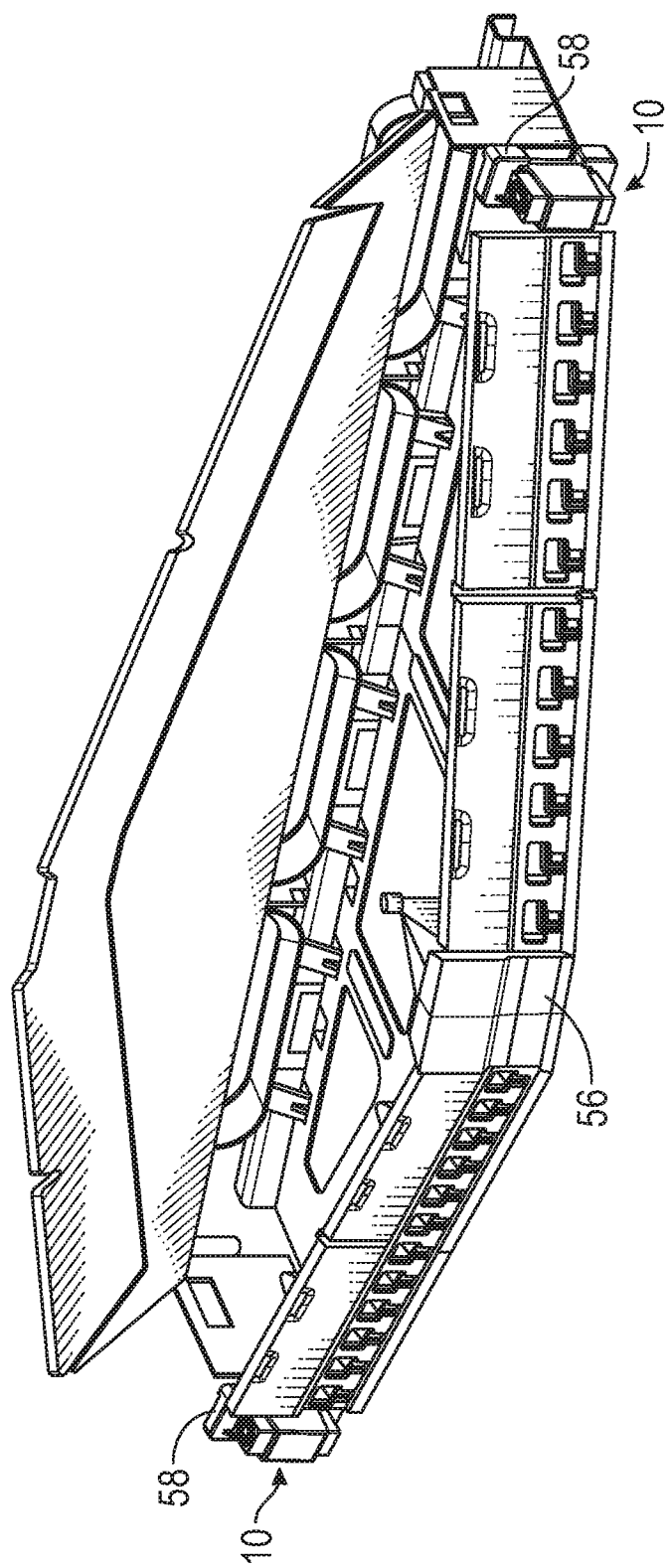
FIG. 4 is a rear left-hand side perspective view of fastening devices of FIG. 1 installed on a panel.
Figure 5:
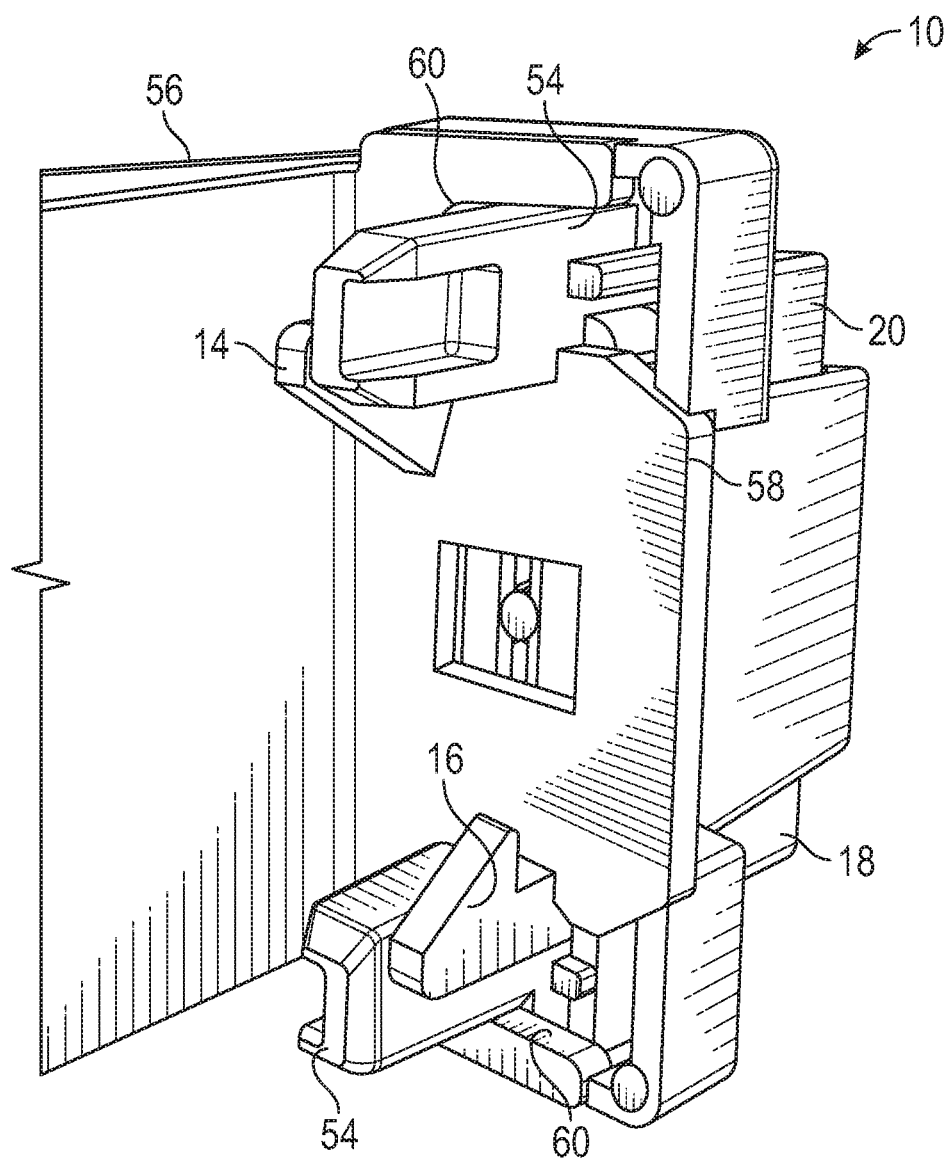
FIG. 5 is a front right-hand side perspective view of the fastening device of FIG. 1 installed on a panel.
Figure 6A:
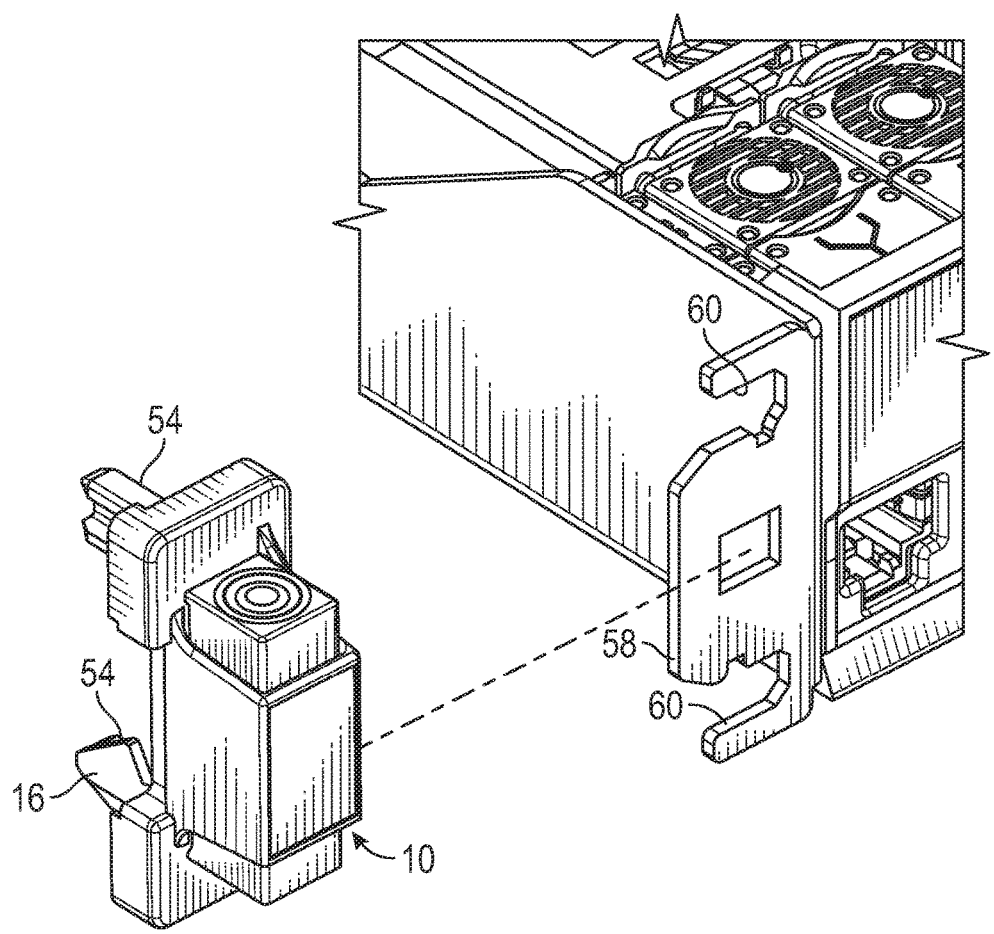
FIGS. 6A-6F are right-hand side perspective views of the fastening device of FIG. 1 during installation on a panel.
Figure 6B:
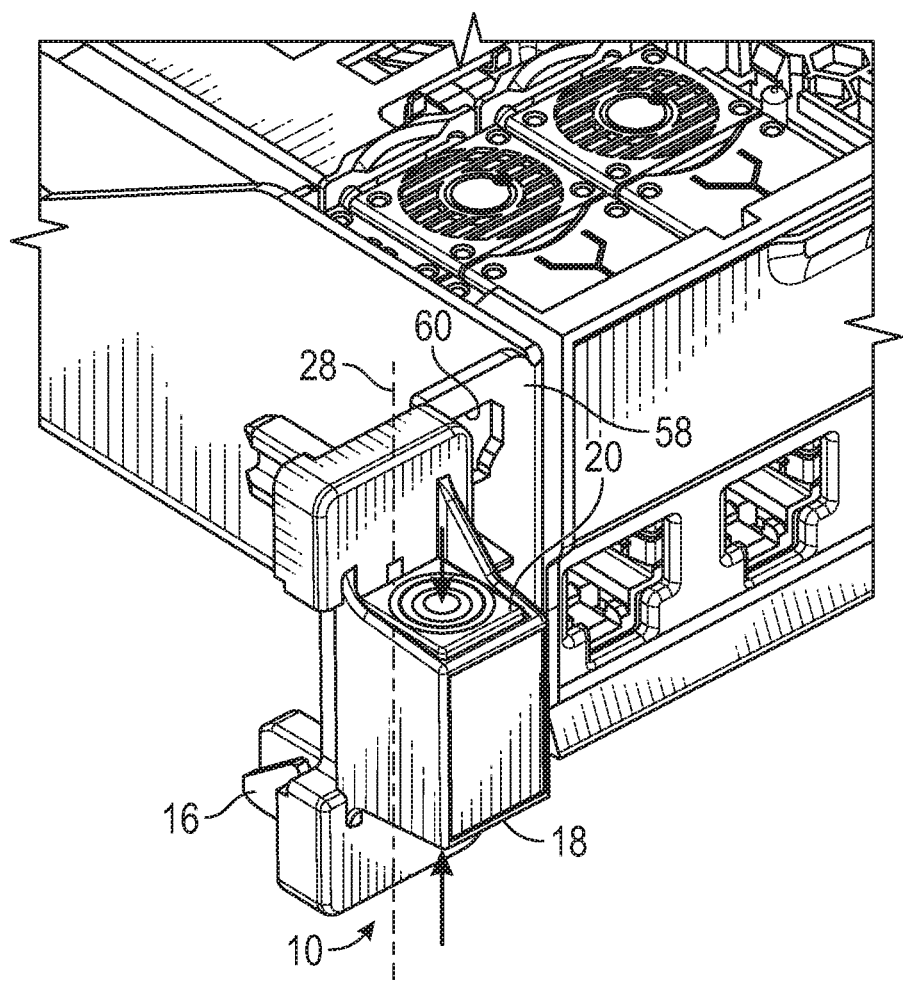
Figure 6C:
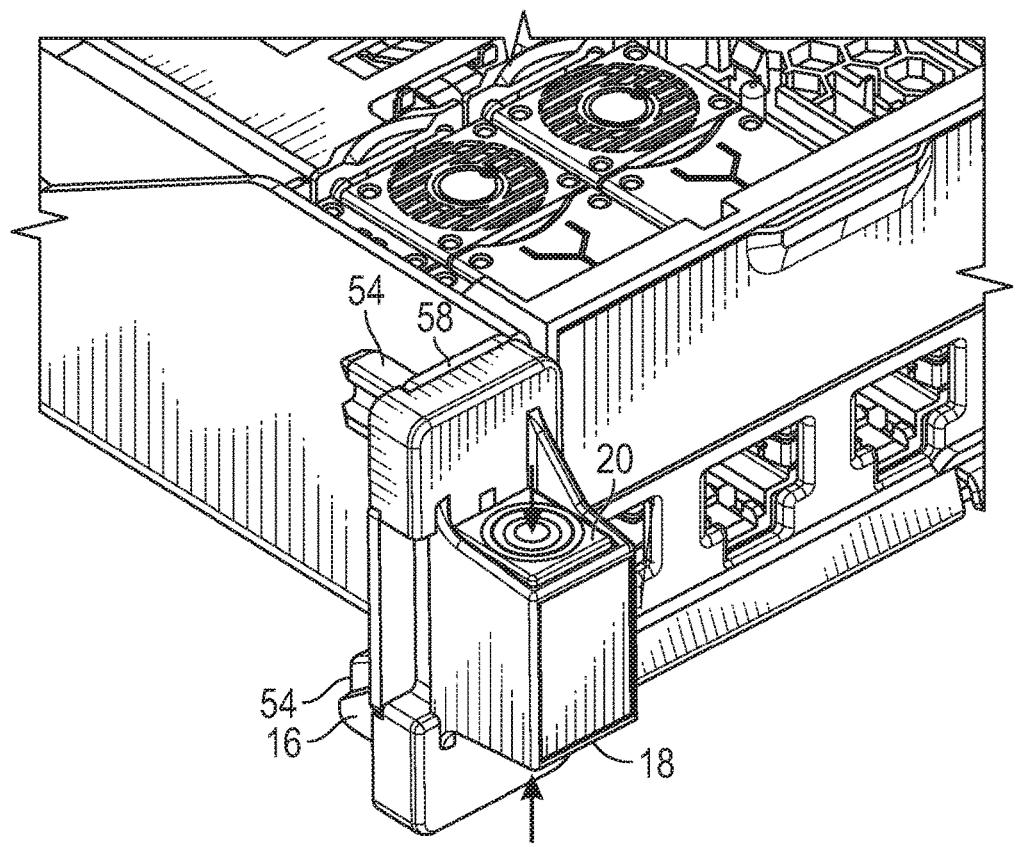
Figure 6D:
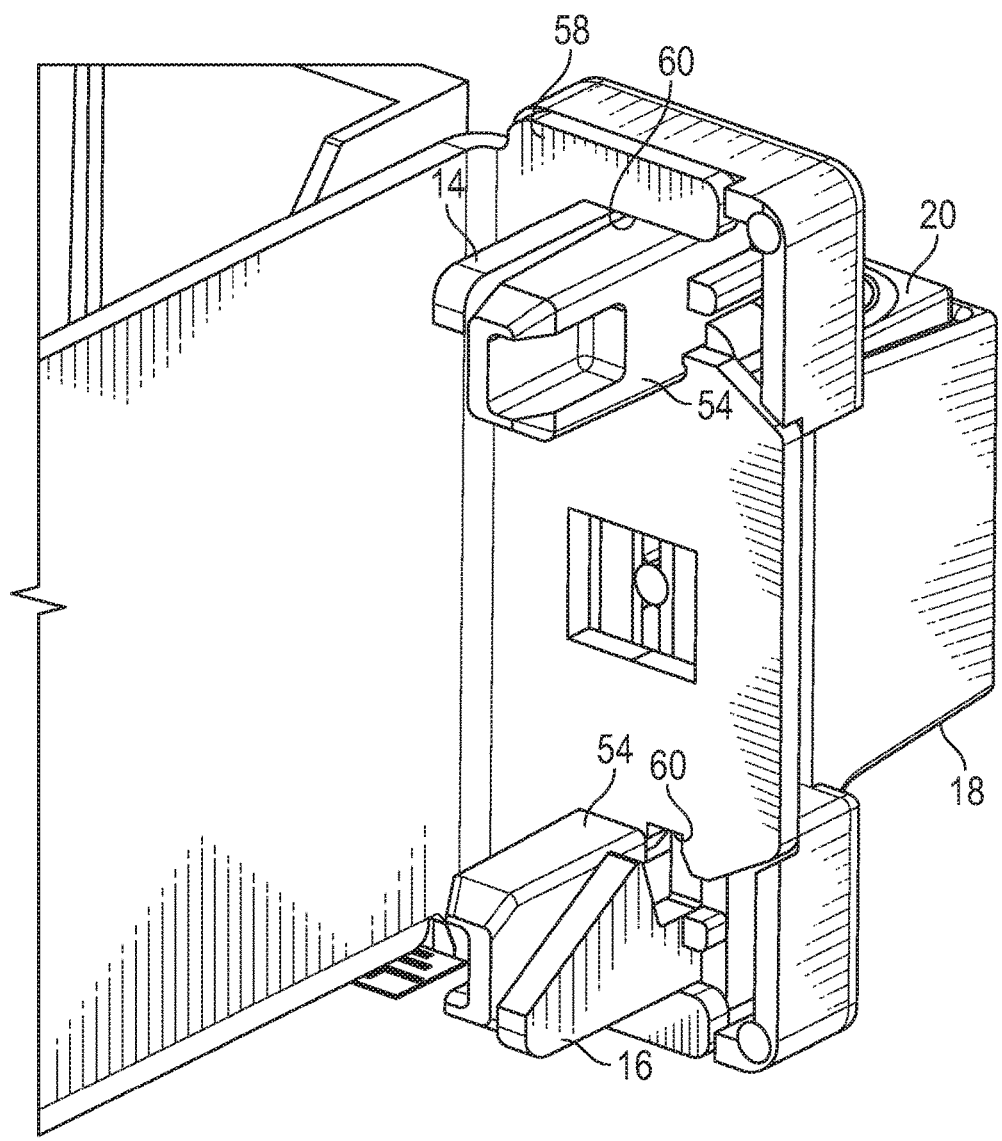
Figure 6E:
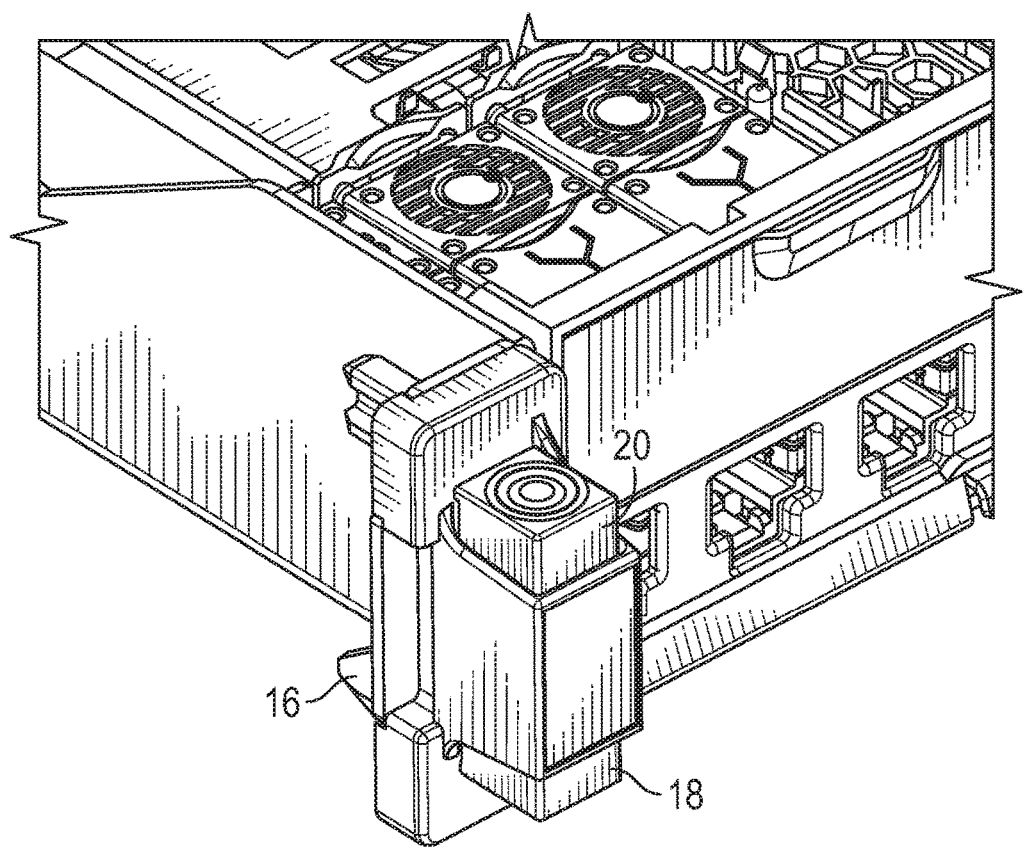
Figure 6F:
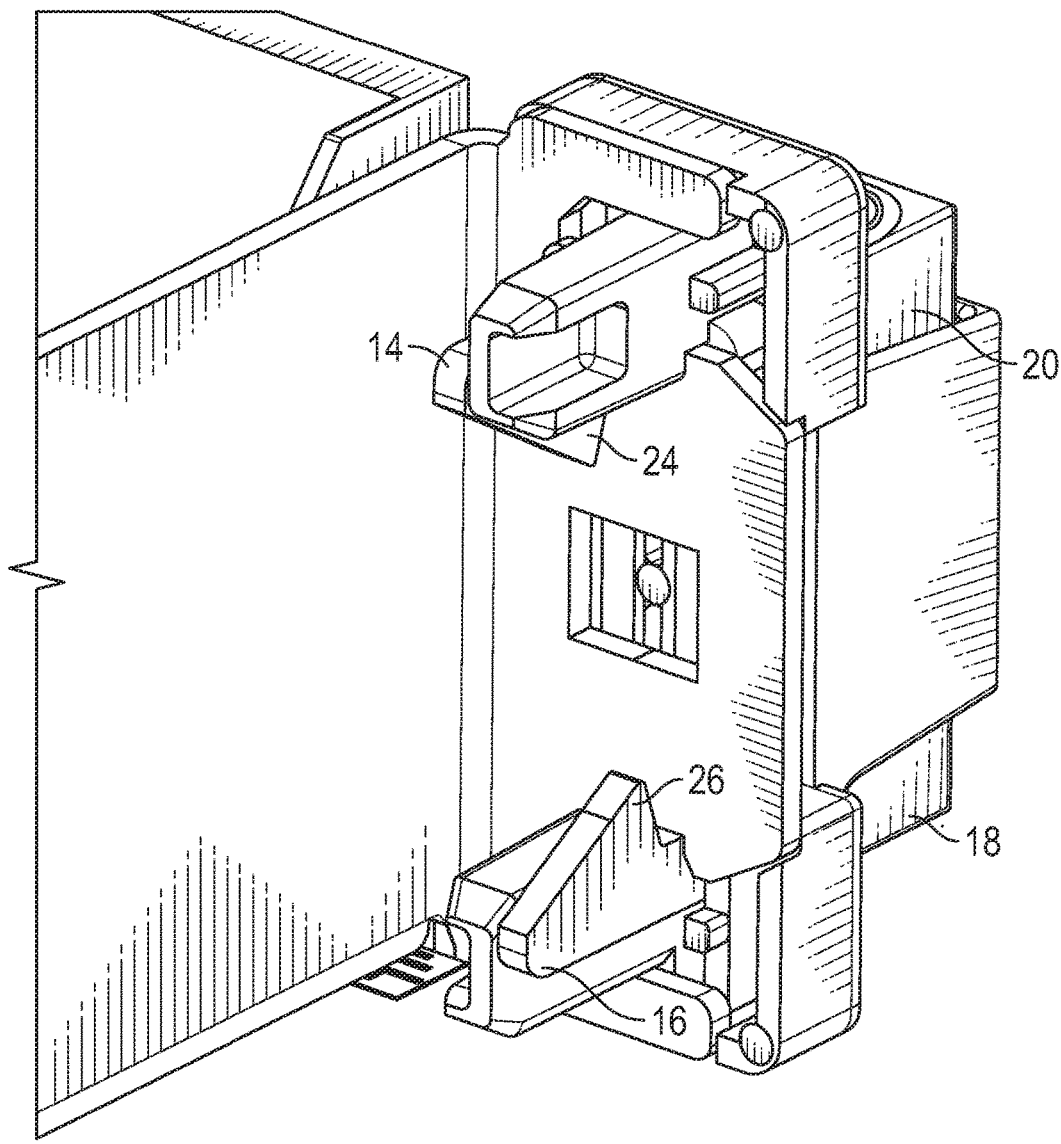

Referring to FIGS. 4 and 5, in operation, a fastening device 10 may be first secured to each side of a panel 56 that is to be installed in an upright rack. The panel 56 includes an open form 58 on each side thereof corresponding to the fastening device 10. Referring to FIGS. 5 and 6A, each open form 58 includes two openings 60, each opening being sized to accept an alignment tab 54 and one of the first or second claws 14, 16 therein. Referring to FIG. 6B, the fastening device 10 may be secured to the open form 58 by first pressing the push buttons 18, 20, for example using a vertical pinching motion, to move the first or second claws 14, 16 away from one another in the first axial direction 28. While keeping the push buttons 18, 20 depressed, the alignment tabs 54 and first and second claws 14, 16 may then be moved into the respective openings 60 in the open form 58, as seen in FIGS. 6C and 6D. The push buttons 18, 20 may then be released, as seen in FIGS. 6E and 6F. This allows the resilient member 52, shown in FIGS. 2 and 3, to push the push buttons 18, 20 and the associated base portions of 32, 44, shown in FIGS. 2 and 3, of the first and second claws 14, 16 away from one another in the first axial direction 28. As the base portions 32, 44 move away from each other, the hook portions 24, 26 of the first and second claws 14, 16 move toward each other in the first axial direction 28, which brings the first and second claws 14, 16 into contact with the sides of the respective openings 60 in the open form 58 and secures the fastening device 10 to the open form 58. As seen in FIG. 6F, the openings 60 are configured so that contact between the first and second claws 14, 16 and the openings 60 of the open form 58 ensures a flush connection between the engagement face 22 of the fastening device 10 and the open forms 58 of the panel 56, thereby eliminating any residual gap between the fastening device 10 and the panel 56, and so that the contact ensures that the fastening device 10 cannot become unintentionally detached (i.e. without actuating the buttons 18, 20) from the panel 56 during subsequent handling.

Figure 7:
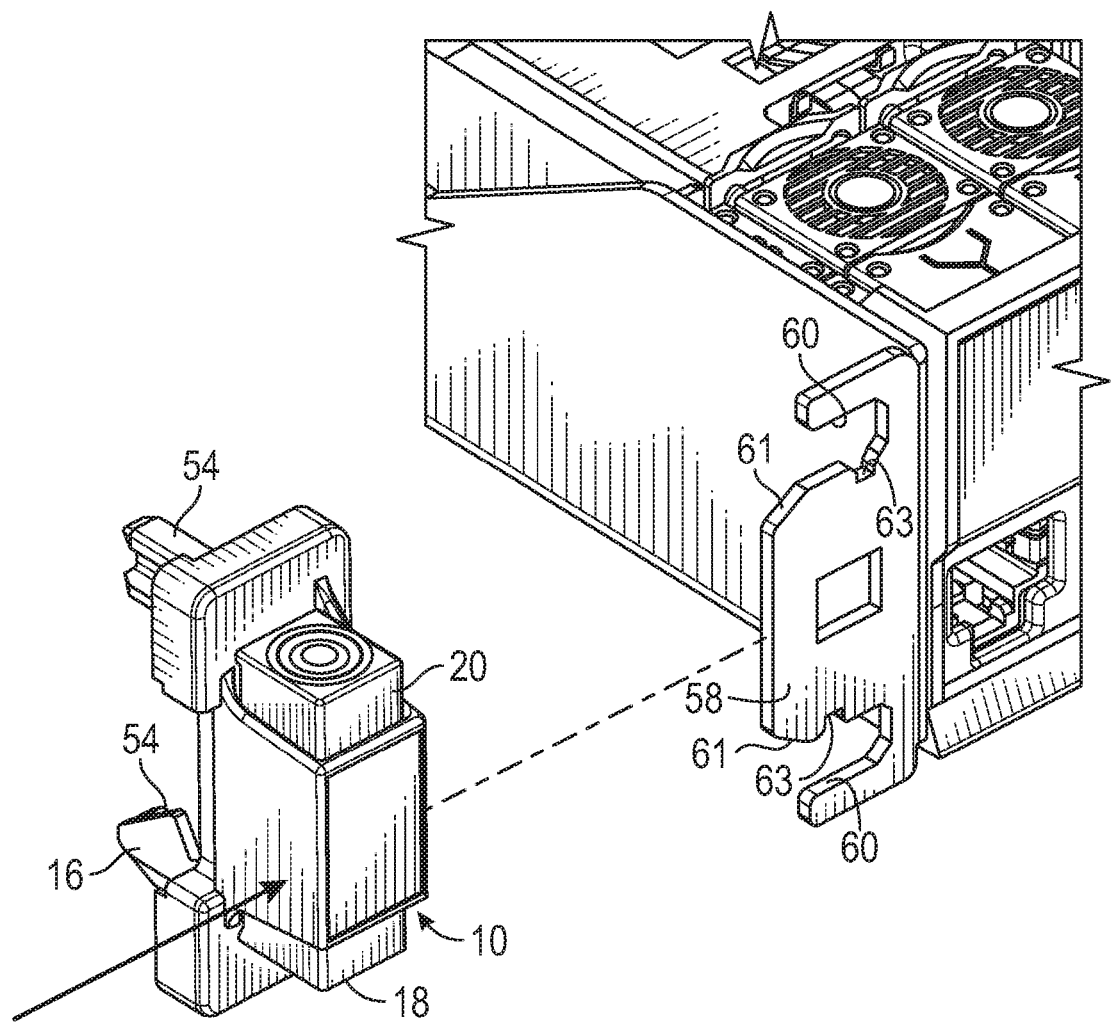
FIG. 7 is a right-hand side perspective view of the fastening device of FIG. 1 during installation on a panel.

Alternatively, referring to FIG. 7, the fastening device 10 may be secured to the open form 58 of the panel 56 simply by pushing the fastening device 10 toward the open form 58 without actuating the push buttons 18, 20. Specifically, as the fastening device 10 is moved from the position shown in FIG. 7, where it is not in contact with the panel 56, toward the open form 58, a portion of the lower surface 38 of the hook portion 24 between the contact surface portion 41 and the elongated body 30 and a portion of the upper surface 48 of the hook portion 26 between the contact surface portion 51 and the elongated body 42 begin to contact edges 61 of the openings 60 of the open form 58 as the alignment tabs 54 and hook portions 24, 26 enter the openings 60. As the fastening device 10 continues to be pushed toward and engages the open form 58, the portions of the lower and upper surfaces 38, 48 slide along the edges of the openings 60 due to their inwardly sloped angles, which moves the first and second hook portions 24 and 26 away from each other in the first axial direction 28. The first and second hook portions 24 and 26 continue to move away from each other in the first axial direction 28 as the fastening device is moved until the first and second hook portions 24 and 26 have moved past the sloped portions of the edges 61. The hook portions 24, 26 and the alignment tabs 54 may continue to be pushed into the openings 60 until the hook portions 24 and 26 engage recesses 63 formed edges 61, which allow the hook portions 24 and 26 to move back toward each other in the first axial direction 28, thereby securing the fastening device 10 to the open form 58. The contact surface portions 41, 51 ensure a flush connection between the engagement face 22 of the fastening device 10 and the open forms 58 of the panel 56, thereby eliminating any residual gap between the fastening device 10 and the panel 56 that could lead to detachment of the fastening device 10 from the panel 56 during subsequent handling.

Figure 8A:
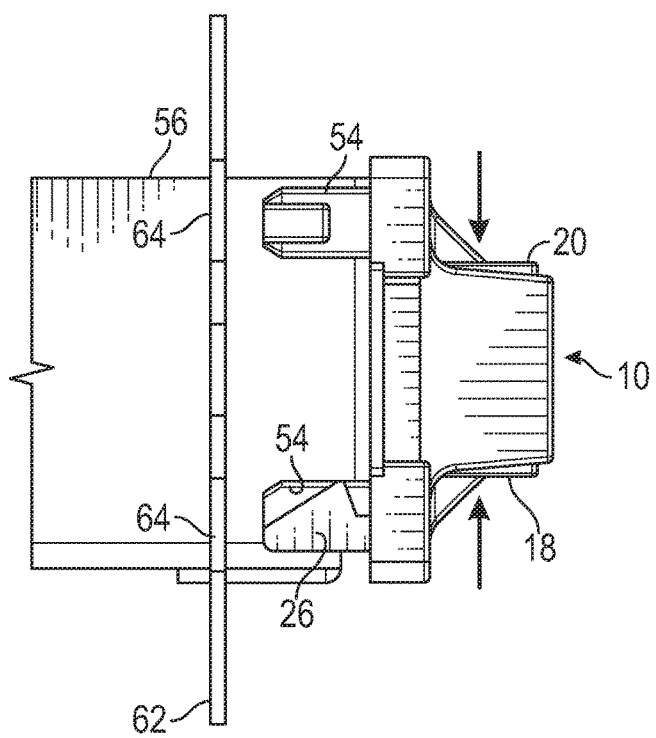
FIGS. 8A-8C are right-hand side views of the fastening device of FIG. 1 being installed on a panel and upright rack.
Figure 8B:
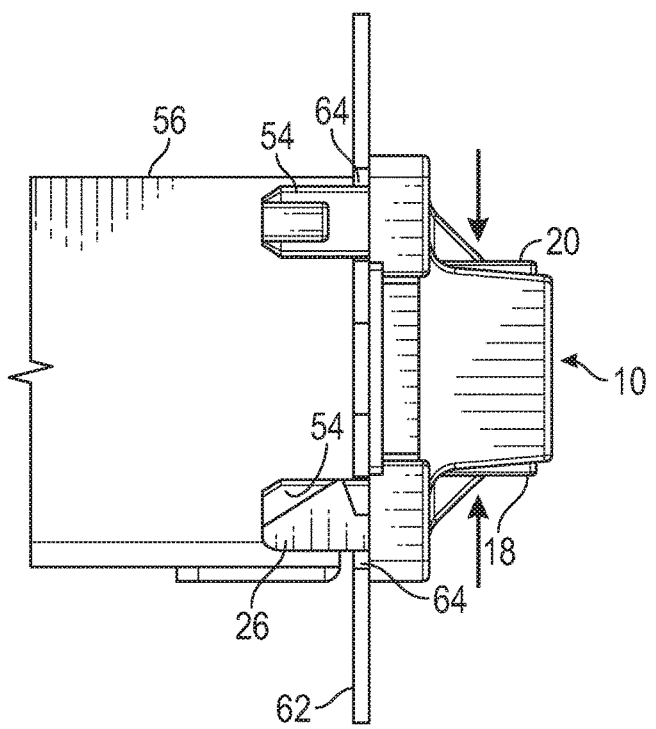
Figure 8C:
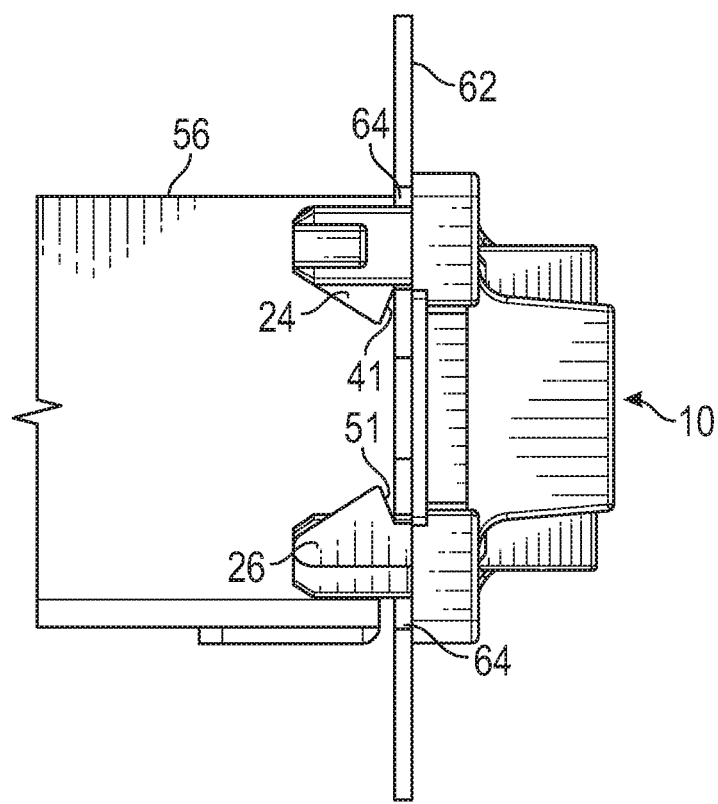
Figure 8D:
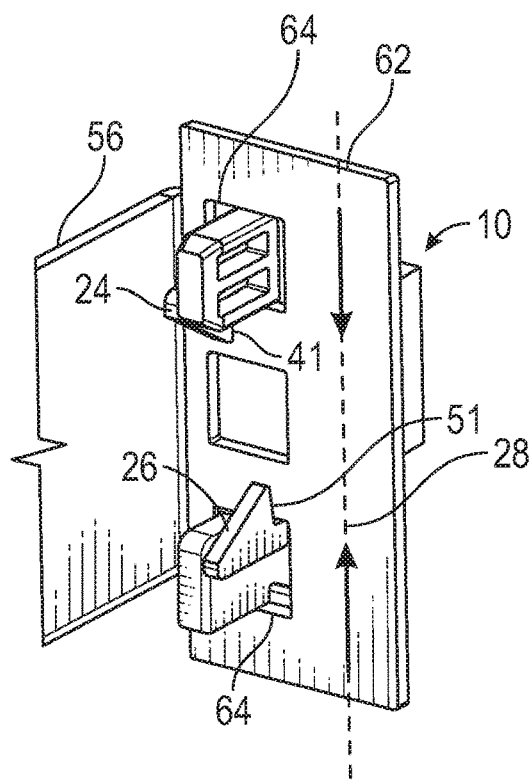
FIG. 8D is a front right-hand side perspective view of FIG. 8C.

Once a fastening device 10 has been secured to each side of the panel 56 as shown in FIGS. 4 and 5, the fastening devices 10 may then be used to secure the panel 56 to an upright rack 62 as seen in FIGS. 8A-8D and 9A-9D. For example, referring to FIG. 8A, the fastening device 10 and panel 56 may be secured to the upright rack 62 by first pressing the push buttons 18, 20, for example using a vertical pinching motion, to move the first or second claws 14, 16 away from one another in the first axial direction 28. While keeping the push buttons 18, 20 depressed, the alignment tabs 54 and first and second claws 14, 16 may then be inserted through the respective openings 64 in the upright rack 62, as seen in FIG. 8B. The push buttons 18, 20 may then be released, as seen in FIG. 8C. This allows the resilient member 52, shown in FIGS. 2 and 3, to push the push buttons 18, 20 and the associated base portions of 32, 44, shown in FIGS. 2 and 3, of the first and second claws 14, 16 away from one another in the first axial direction 28. As the base portions 32, 44 move away from each other, the hook portions 24, 26 of the first and second claws 14, 16 move toward each other in the first axial direction 28, which brings the contact surface portions 41, 51 into contact with the upright rack 62 and secures the fastening device 10 and panel 56 to the upright rack 62. As seen in FIG. 8C, the contact surface portions 41, 51 ensure a flush connection between the engagement face 22 of the fastening device 10, the panel 56, and the upright rack 62, thereby eliminating any residual gap between the fastening device 10, the panel 56 and/or the upright rack 62.

Figure 9A:
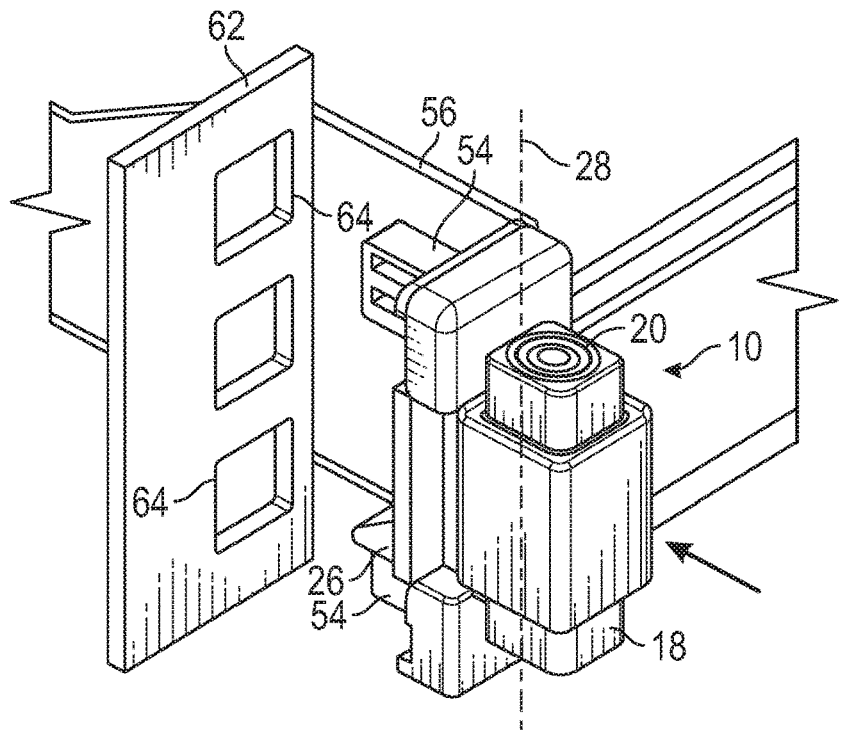
FIG. 9A is a rear right-hand side perspective view of the fastening device of FIG. 1 being installed on a panel and upright rack.
Figure 9B:
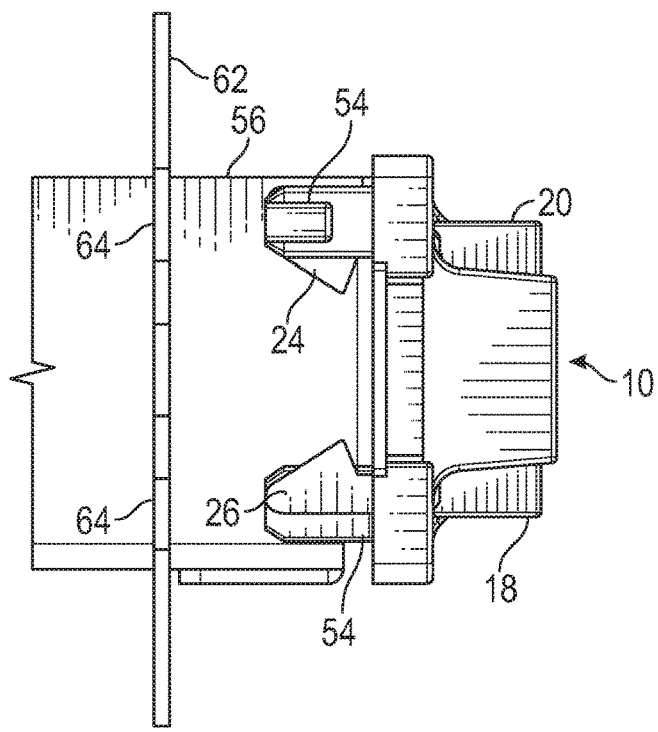
FIGS. 9B-9D are right-hand side views of the fastening device of FIG. 1 being installed on a panel and upright rack.
Figure 9C:
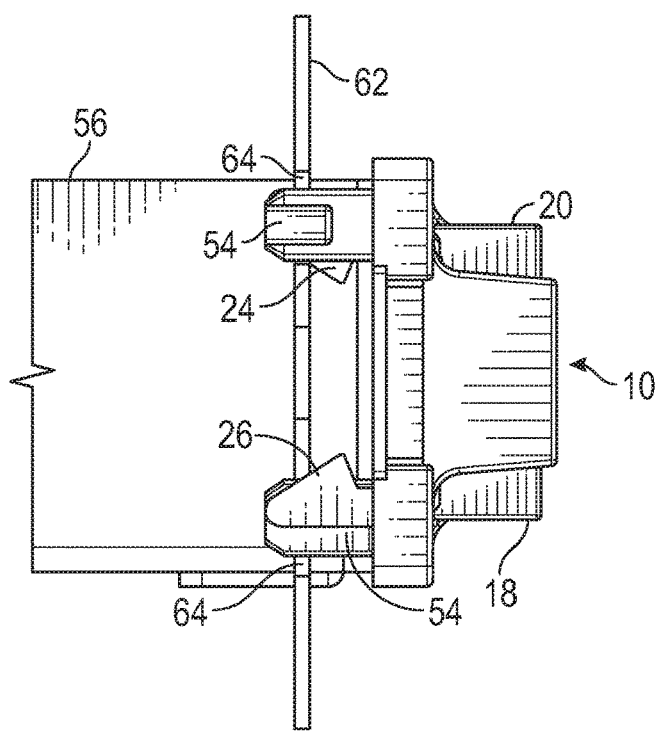
Figure 9D:
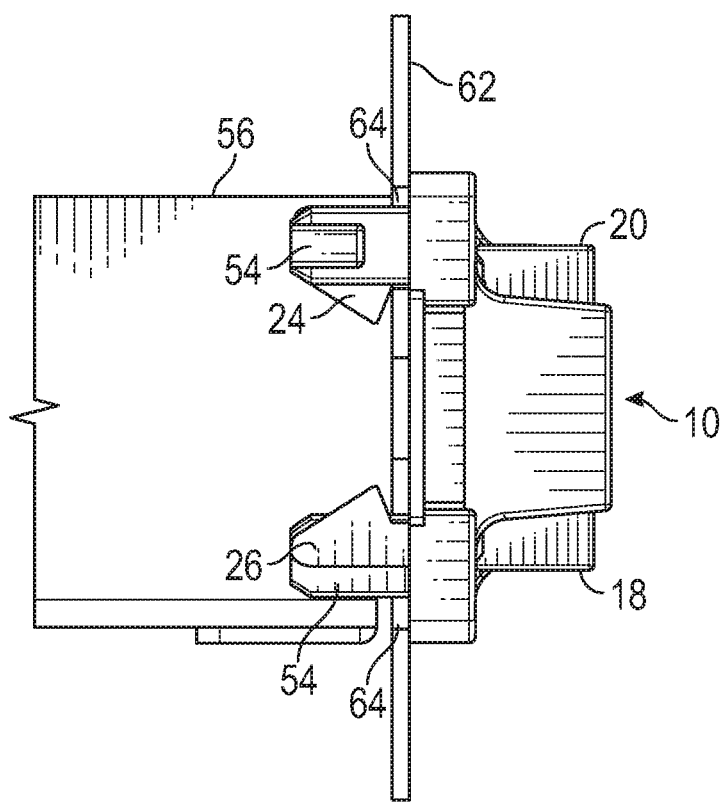

Referring to FIGS. 9A-9D, the fastening device 10 may, alternatively, engage openings 64 of the upright rack 62 in a similar manner to that described in connection with FIG. 7 by pushing the fastening device 10 and/or panel 56, to which the fastening device 10 is secured, toward the upright rack 62 without first actuating the push buttons 18, 20. For example, as the fastening device 10 and panel 56 are moved from the position shown in FIGS. 9A and 9B, where the fastening device 10 is not in contact with the upright rack 62, toward the upright rack 62, the lower surface 38 of the hook portion 24 and the upper surface 48 of the hook portion 26 begin to contact edges of the openings 64 of the upright rack 62 as the alignment tabs 54 and hook portions 24, 26 enter the openings 64. As seen in FIG. 9C, as the fastening device 10 and/or panel 56 continues to be pushed toward and engages the upright rack 62, the lower and upper surfaces 38, 48 slide along the edges of the openings 64 due to their inwardly sloped angles, which moves the first and second hook portions 24 and 26 away from each other in the first axial direction 28. The first and second hook portions 24 and 26 continue to move away from each other in the first axial direction 28 as the fastening device 10 continues to move until the peaks of the inverted triangle and triangle of the hook portions 24 and 26, respectively, pass through the openings 64. Referring to FIG. 9D, once the peaks of the inverted triangle and triangle of the hook portions 24 and 26, respectively, pass through the openings 64, the hook portions 24 and 26 move back toward each other in the first axial direction 28, which brings the contact surface portions 41, 51 into contact with the upright rack 62, thereby securing the fastening device 10 and panel 56 to the upright rack 62. As seen in FIG. 9D, the contact surface portions 41, 51 ensure a flush connection between the engagement face 22 of the fastening device 10, the panel 56, and the upright rack 62, thereby eliminating any residual gap between the fastening device 10, the panel 56 and/or the upright rack 62.

Figure 10:
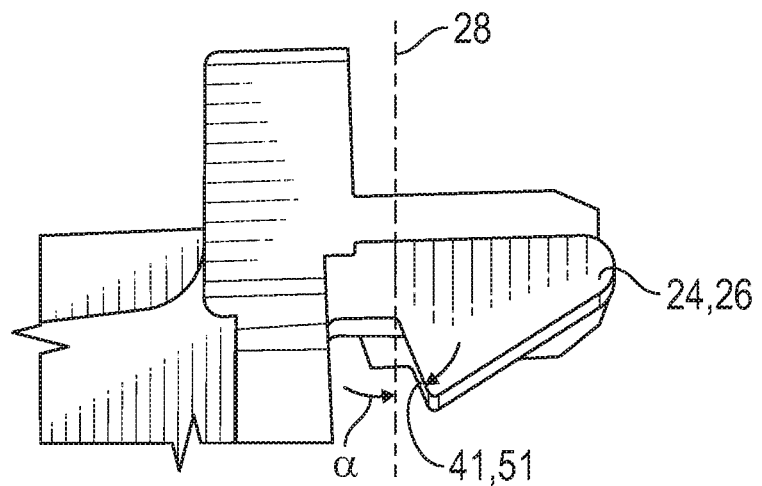
FIG. 10 is an enlarged view of a hook portion of the fastening device of FIG. 1.

As seen in FIG. 10, the contact surface portions 41, 51 of the hook portions 24, 26 may advantageously be sloped at a non-zero angle $\alpha$ relative to the first axial direction 28, which allows the hook portions 24, 26 to adapt to upright racks of varying thicknesses while maintaining secure holds therewith.

If, for any reason, the fastening device 10 needs to be removed from the panel 56 and/or upright rack 62 after being secured thereto, the push buttons 18, 20 may be pushed toward one another in the first axial direction 28, until the hook portions 24, 26 reach the positions shown in FIG. 8B, at which point the fastening device 10 may be withdraw from the upright rack 62 and/or open form 58 of the panel 56 by reversing the securing steps discussed above in connection with FIGS. 6A-6F and 8A-8D. Additionally, although attachment of the fastening device 10 to the panel 56 has been described above in connection with the open form 58 shown in FIG. 6A, the openings 60 of the open form 58 could instead be similar to the openings 64 of the upright rack 62, shown in FIG. 9A. In this case the fastening device 10 would then be secured to the panel 56 in substantially the same manner as the upright rack 62 as described in connection with FIG. 8A-8D or 9A-9D. It should be readily understood from the present disclosure that that fastening device 10 could then be secured to both the panel 56 and upright rack 62 at the same time by aligning the openings 60 in the open forms 58 of the panel 56 with the openings 64 in the upright rack 62 and then inserting the alignment tabs 54 and hook portions 24, 26 through the openings 60 and openings 64 using substantially the same techniques described above.

Figure 11A:
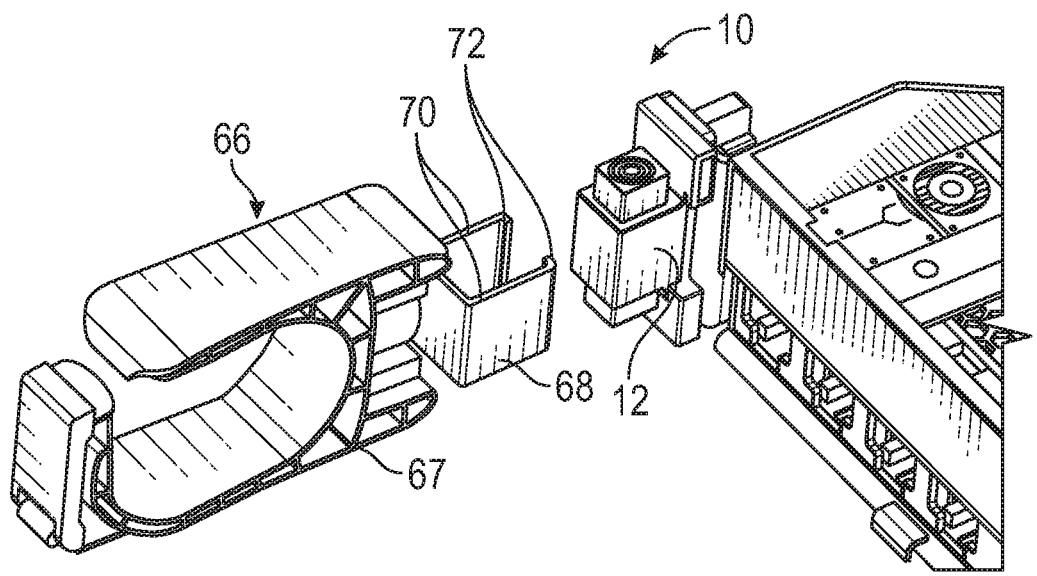
FIG. 11A is a rear left-hand side perspective view of the fastening device of FIG. 1 with a removable accessory being attached thereto.
Figure 11B:
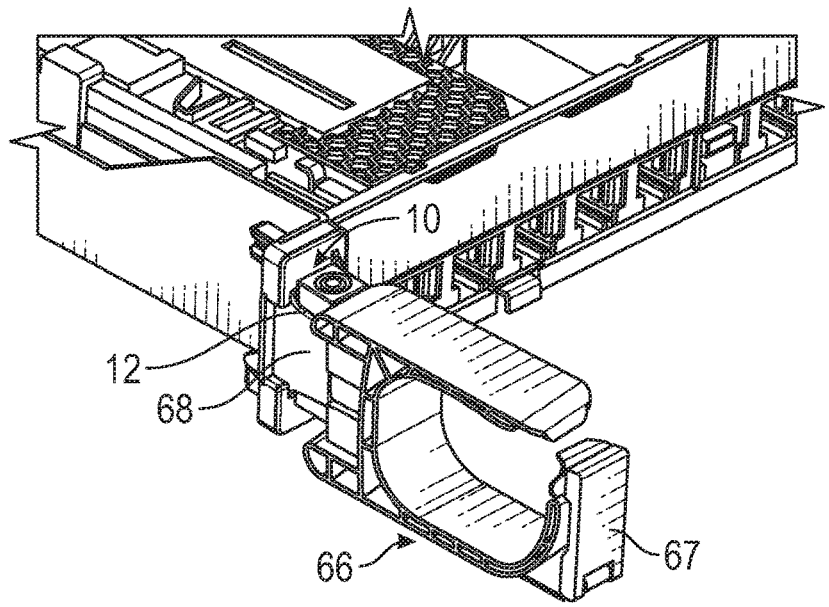
FIG. 11B is a rear right-hand side perspective view of the fastening device and removable accessory of FIG. 11A.

Referring to FIGS. 11A and 11B, a removable accessory 66 is shown. The removable accessory 66 may be, for example, a cable management clip for copper cable or the like. The removable accessory 66 includes a body 67 and a clip 68 extending from the body 67. The clip 68 includes arms 70 configured to accept the housing 12 of the fastening device 10 therebetween, each arm 70 including an engagement feature 72 on a distal end thereof for removably securing the accessory 66 to the housing 12.

Figure 12:
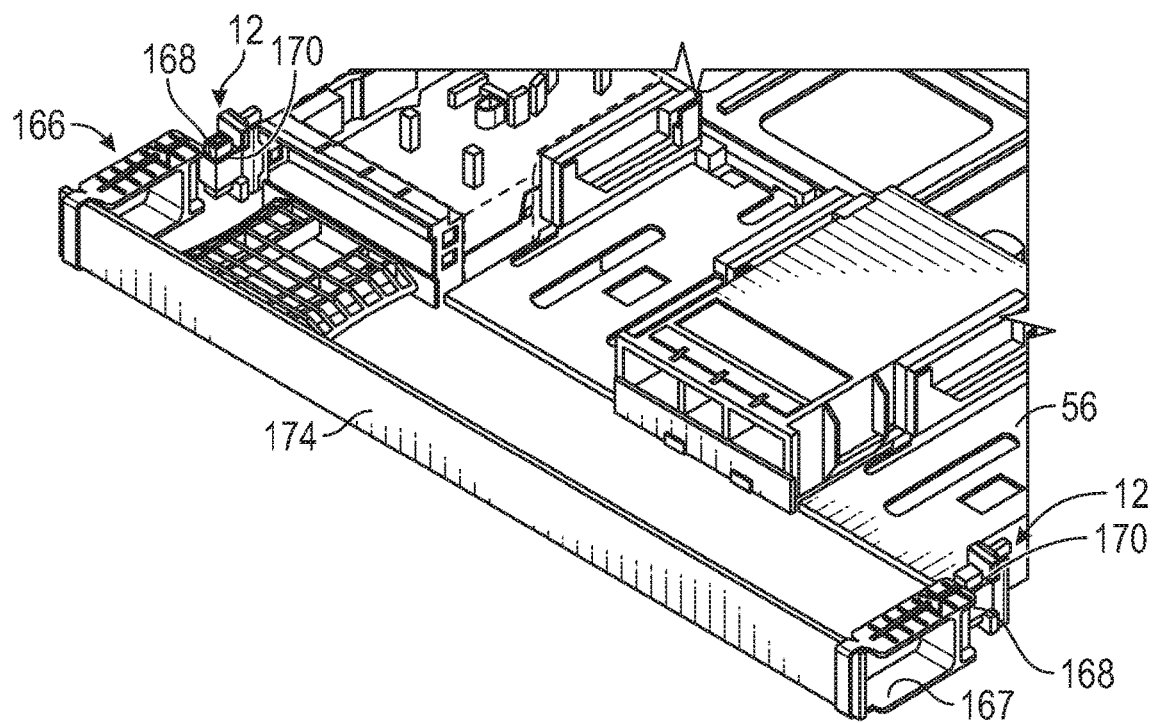
FIG. 12 is a rear left-hand side perspective view of fastening devices of FIG. 1 with a removable accessory attached thereto.

Referring to FIG. 12, wherein like numerals represent like elements, another removable accessory 166 is shown. The removable accessory 166 is similar to the removable accessory 66 except that the removable accessory 166 is configured to engage both fastening devices 12 secured to both sides of panel 56 as seen in FIG. 4. The removable accessory 166 includes a body 167 and two clips 168 extending from the body 167. Each clip 168 includes arms 170 configured to accept a housing 12 of a fastening device 10 therebetween, with each arm 170 including an engagement feature on a distal end thereof for removably securing the accessory 166 to the housing 12 in the same manner as the engagement features 72, shown in FIG. 11A. The removable accessory 166 may be, for example, a fiber optic cable management clip or the like and may include a protective door 174 connected between the clips 168 and configured to extending across a face of the panel 56.

The fastening device 10 according to the present disclosure advantageously provides a quick coupling connection for securing panels 56 to upright racks 62 in telecommunications or information technology data centers, wherein the fastening device 10 allows the panels 56 to be installed on and/or removed from the upright racks 62 without the use of tools. This allows an electrical installer to easily position the panel 56 on the rack 62 and the re-position the panel 56 in different locations, as desired. For example, the panel 56 may be positioned temporarily during installation, for example at chest height on the rack 62 while the wiring is being done, and then moved to its final position on the rack 62 when the wiring has been completed.

Furthermore, the fastening device 10 may advantageously be secured in place on both the panels 56 and the upright racks 62 simply by pushing the fastening device 10 toward the respective panel 56 and/or upright rack 62 until the fastening device clicks into place with the hook portions 24, 26 engaging the panel 56 or upright rack 62. As described above, the fastening device 10 may also advantageously be mounted on the panel 56 prior to installation of the panel 56 into the upright rack 62. Thus, a fastening device 10 may be secured to each side of the panel 56 prior to installation of the panel 56 into the upright rack 62, without the risk that either of the fastening devices 10 falls off of the panel 56 prior to installation in the upright rack 62. Additionally, for upright racks that only have threaded holes and, therefore, require the use of screws for installation of panels therein, the quick coupling fastening devices 10 of the present disclosure may be readily detached from the panels 56 to allow for the use of screws in securing the panel 56 to the upright rack.

As described above, the first and second claws 14, 16 of the present disclosure may be formed from steel to provide increased strength to the fastening device 10 and, therefore, advantageously provide the fastening device 10 with increased loading capabilities. Providing the push buttons 18, 20 with flat actuation surfaces that are parallel to one another also provides for better gripping of the fastening device 10 during actuation of the push buttons 18, 20.

Figure 13:
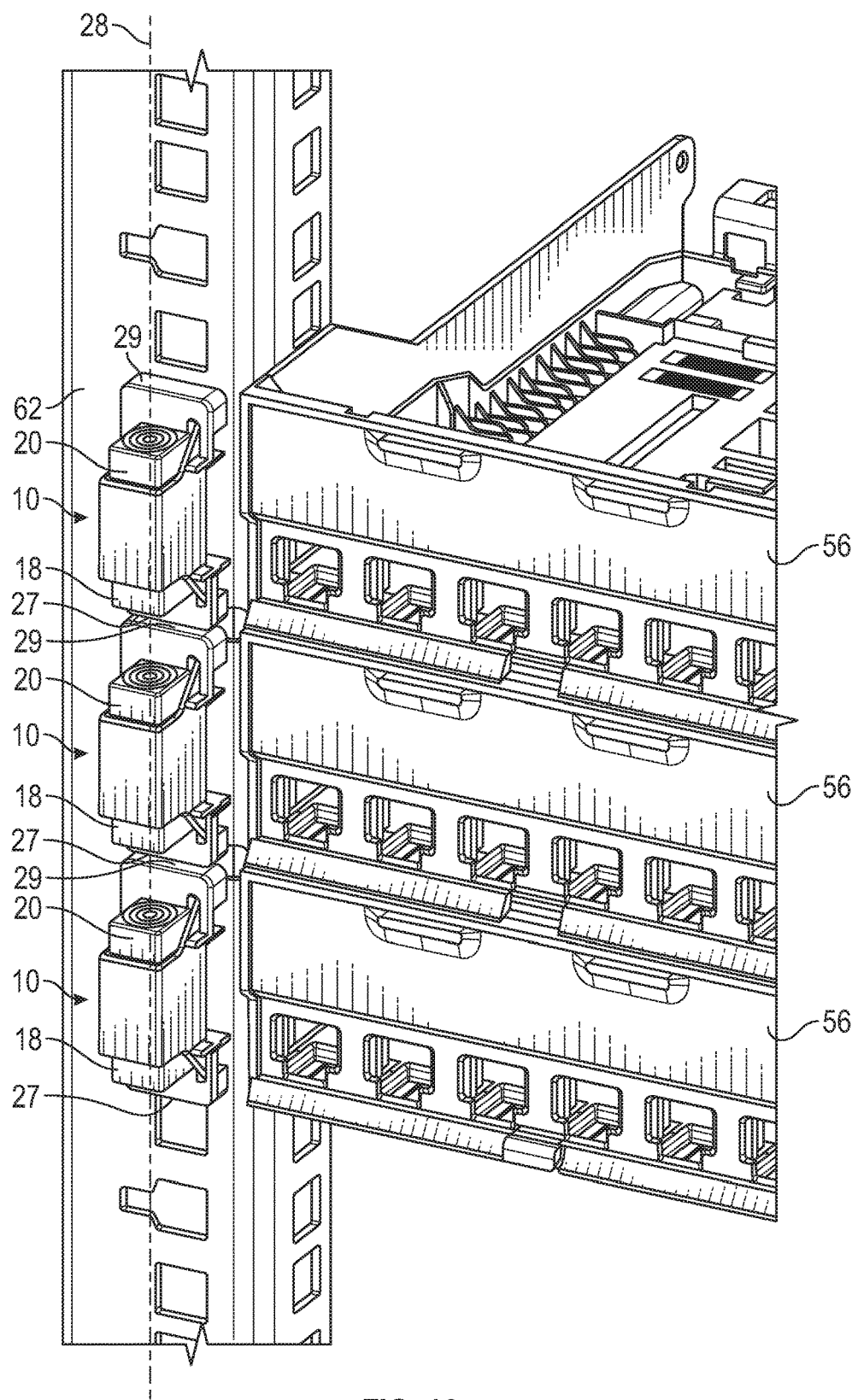
FIG. 13 is a front view of an upright rack with multiple panels secured thereto by fastening devices according to FIG. 1.

As seen in FIG. 13, the fastening devices 10 of the present disclosure advantageously allow multiple panels 56 to be stacked directly on top of one another in one upright rack 62, with the fastening devices 10 securing each panel 56 to the upright rack 62. By recessing the first and second push buttons 18, 20 relative to lower and upper ends 27, 29, respectively, of the housing 12 in the first axial direction 28, gaps 76 are advantageously formed between the push buttons 18, 20 of immediately adjacent fastening device 10 in the axial direction 28. These gaps 76 advantageously allow an installer to actuate the push buttons 18, 20 even when the panels 56 are stacked.

While the principles of the present disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure.

What is claimed is:

1. A fastening device comprising:
    a housing;
    first and second buttons disposed at opposite ends of the housing in a first axial direction, each of the first and second buttons being actuatable in the first axial direction; and
    first and second claws slidably disposed within the housing, each of the first and second claws including a hook portion extending outward from an engagement face of the housing;
    wherein each of the first and second claws engages one of the first or second buttons within the housing so that relative movement of the first and second buttons toward one another moves the hook portions of the first and second claws away from one another in the first axial direction.

2. The fastening device according to claim 1, additionally comprising first and second alignment tabs extending outward from the engagement face adjacent the hook portions of the first and second claws, respectively.

3. The fastening device according to claim 2, wherein the hook portions are positioned closer to one another in the first axial direction than the first and second alignment tabs when the first and second buttons are un-actuated.

4. The fastening device according to claim 3, wherein the hook portions are positioned the same distance from one another in the first axial direction as the first and second alignment tabs when the first and second buttons are fully actuated.

5. The fastening device according to claim 1, wherein the hook portion of the first claw includes a first engagement feature and the hook portion of the second claw includes a second engagement feature, each of the first and second engagement features including a surface configured to contact an edge of an opening in an upright rack as the fastening device is pushed toward the upright rack; and wherein, without actuation of the first and second buttons, the contact moves the first and second claws away from each other in the first axial direction as the first and second claws are moved into the openings in the upright rack.

6. The fastening device according to claim 1, wherein the hook portion of the first claw includes an engagement feature in the shape of an inverted triangle and the hook portion of the second claw includes an engagement feature in the shape of a triangle.

7. The fastening device according to claim 6, wherein an upper surface of the inverted triangle extends perpendicular to the first axial direction, and a lower surface of the inverted triangle includes a first actuation surface portion sloping downward relative to the upper surface from a distal end of the hook portion to a peak and a first contact surface portion sloping upward relative to the upper surface from the peak toward the engagement face.

8. The fastening device according to claim 7, wherein the slope of the first contact surface portion relative to the upper surface is greater than the slope of the first actuation surface portion relative to the upper surface.

9. The fastening device according to claim 8, wherein a lower surface of the triangle extends perpendicular to the first axial direction, and an upper surface of the triangle includes a second actuation surface portion sloping upward relative to the lower surface from a distal end of the hook portion to a peak and a second contact surface portion sloping downward relative to the upper surface from the peak toward the engagement face.

10. The fastening device according to claim 9, wherein the slope of the second contact surface portion relative to the lower surface is greater than the slope of the second actuation surface portion relative to the lower surface.

11. The fastening device according to claim 1, further comprising a resilient member disposed within the housing, the resilient member biasing the first and second buttons away from one another in the first axial direction and biasing the hook portions of the first and second claws toward one another in the first axial direction.

12. A fastening device comprising:

a housing;

first and second claws, each of the first and second claws including a base portion disposed within the housing and a hook portion extending outwardly from an engagement face of the housing, the first and second claws each being slidably movable relative to the housing in a first axial direction;

first and second buttons extending outward from the housing at opposite ends thereof and slidable relative thereto in the first axial direction, each of the first and second buttons engaging the base portion of one of the first and second claws; and a resilient member disposed within the housing, the resilient member biasing the base portions and the first and second buttons in a direction away from one another;

wherein relative movement of the first and second buttons toward one another compresses the resilient member and moves the hook portions of the first and second claws away from one another in the first axial direction.

13. The fastening device according to claim 12, additionally comprising first and second alignment tabs extending outward from the engagement face adjacent the hook portions of the first and second claws, respectively.

14. The fastening device according to claim 13, wherein the hook portions are positioned closer to one another in the first axial direction than the first and second alignment tabs when the first and second buttons are un-actuated.

15. The fastening device according to claim 14, wherein the hook portions are positioned the same distance from one another in the first axial direction as the first and second alignment tabs when the first and second buttons are fully actuated.

16. The fastening device according to claim 12, wherein the hook portion of the first claw includes a first engagement feature and the hook portion of the second claw includes a second engagement feature, each of the first and second engagement features including a surface configured to contact an edge of an opening in an upright rack as the fastening device is pushed toward the upright rack; and wherein, without actuation of the first and second buttons, the contact moves the first and second claws away from each other in the first axial direction as the first and second claws are moved into the openings in the upright rack.

17. The fastening device according to claim 12, wherein the hook portion of the first claw includes an engagement feature in the shape of an inverted triangle and the hook portion of the second claw includes an engagement feature in the shape of a triangle.

18. The fastening device according to claim 17, wherein an upper surface of the inverted triangle extends perpendicular to the first axial direction, and a lower surface of the inverted triangle includes a first actuation surface portion sloping downward relative to the upper surface from a distal end of the hook portion to a peak and a first contact surface portion sloping upward relative to the upper surface from the peak toward the engagement face; and wherein a lower surface of the triangle extends perpendicular to the first axial direction, and an upper surface of the triangle includes a second actuation surface portion sloping upward relative to the lower surface from a distal end of the hook portion to a peak and a second contact surface portion sloping downward relative to the upper surface from the peak toward the engagement face.

19. The fastening device according to claim 18, wherein the slope of the first contact surface portion relative to the upper surface is greater than the slope of the first actuation surface portion relative to the upper surface; and wherein the slope of the second contact surface portion relative to the lower surface is greater than the slope of the second actuation surface portion relative to the lower surface.

20. A quick fastening device for an upright rack of a data center, the quick fastening device comprising:

a housing;

first and second buttons extending outward from the housing at opposite ends thereof and slidable relative thereto in the first axial direction;

a first claw including an elongated body, a first base portion formed at one end of the elongated body, and a first hook portion formed at the other end of the elongated body, the first claw being slidably disposed within the housing with the first base portion engaging the first push button and the first hook portion extending outwardly from an engagement face of the housing;

a second claw identical to the first claw, the second claw including an elongated body, a second base portion formed at one end of the elongated body, and a second hook portion formed at the other end of the elongated body, the second claw being inverted relative to the first claw and slidably disposed within the housing with the second base portion engaging the second push button and the second hook portion extending outwardly from the engagement face of the housing; and
a resilient member disposed within the housing, the resilient member biasing the first and second base portions and the first and second buttons away from one another in the first axial direction and biasing the first and second hook portions toward one another in the first axial direction;
wherein relative movement of the first and second buttons toward one another compresses the resilient member and moves the first and second hook portions of the first and second claws away from one another in the first axial direction.

* * * * *